United States Patent
Dix

(10) Patent No.: US 8,193,589 B2
(45) Date of Patent: Jun. 5, 2012

(54) WORK FUNCTION BASED VOLTAGE REFERENCE

(75) Inventor: Gregory Dix, Tempe, AZ (US)

(73) Assignee: Microchip Technology Incorporated, Chandler, AZ (US)

( * ) Notice: Subject to any disclaimer, the term of this patent is extended or adjusted under 35 U.S.C. 154(b) by 157 days.

(21) Appl. No.: 12/719,501

(22) Filed: Mar. 8, 2010

(65) Prior Publication Data

US 2010/0164468 A1 Jul. 1, 2010

Related U.S. Application Data

(62) Division of application No. 12/098,660, filed on Apr. 7, 2008, now Pat. No. 7,727,833.

(51) Int. Cl.
*H01L 27/088* (2006.01)
(52) U.S. Cl. ........................ 257/392; 327/561
(58) Field of Classification Search .............. 257/392; 327/561
See application file for complete search history.

(56) References Cited

U.S. PATENT DOCUMENTS

| | | | |
|---|---|---|---|
| 4,327,320 A | 4/1982 | Oguey et al. | 323/313 |
| 6,211,555 B1 | 4/2001 | Randazzo et al. | 257/368 |
| 6,255,874 B1 | 7/2001 | Shay | 327/170 |
| 6,437,550 B2 | 8/2002 | Andoh et al. | 438/217 |
| 7,426,146 B2 * | 9/2008 | Aota et al. | 365/189.09 |
| 7,504,874 B2 | 3/2009 | Oehm | 327/513 |
| 2004/0207380 A1 | 10/2004 | Ariki | 323/313 |
| 2006/0033128 A1 | 2/2006 | Chi | 257/279 |

OTHER PUBLICATIONS

Oguey, Henri J. et al., "MOS Voltage Reference Based on Polysilicon Gate Work Function Difference", IEEE Journal of Solid-State Circuits, vol. SC-15, No. 3, pp. 264-269.

Blauschild, Robert A. et al., "A New NMOS Temperature-Stable Voltage Reference", IEEE Journal of Solid-State Circuits, vol. SC-13, No. 6, pp. 767-774.

* cited by examiner

*Primary Examiner* — Douglas Menz
(74) *Attorney, Agent, or Firm* — King & Spalding L.L.P.

(57) ABSTRACT

A voltage reference is created from an operational amplifier circuit having two substantially identical P-channel metal oxide semiconductor (P-MOS) transistors with each one having a different gate dopant. The different gate dopants result in different threshold voltages for each of the two otherwise substantially identical P-MOS transistors. The difference between these two threshold voltages is then used to create the voltage reference equal to the difference. The two P-MOS transistors are configured as a differential pair in the operational amplifier circuit and the output of the operational amplifier is used as the voltage reference.

22 Claims, 4 Drawing Sheets

US 8,193,589 B2

WORK FUNCTION BASED VOLTAGE REFERENCE

RELATED PATENT APPLICATION

This patent application is a divisional of and claims priority to commonly owned U.S. patent application Ser. No. 12/098,660; filed Apr. 7, 2008 now U.S. Pat. No. 7,727,833; entitled "Work Function Based Voltage Reference," by Gregory Dix; and is related to commonly owned U.S. patent application Ser. No. 12/098,689, filed Apr. 7, 2008, entitled "A Temperature Compensated Work Function Based Voltage Reference" by Gregory Dix, and both are hereby incorporated by reference herein for all purposes.

TECHNICAL FIELD

The present disclosure relates generally to voltage references, and more particularly, to a voltage reference based upon the work function difference between two differently doped gates of P-channel devices used as a differential pair of an operational amplifier.

BACKGROUND

Voltage references, such as bandgap voltage references, are widely used in various analog and digital integrated circuit functions, e.g., analog-to-digital and digital-to-analog conversion. The operation of a bandgap voltage reference relies upon the voltage difference between two diodes, often operated at the same current and having different junction areas, that is used to generate a proportional to absolute temperature (PTAT) current in a first resistor. This current is used to generate a voltage in a second resistor. This voltage in turn is added to the voltage of one of the diodes (or a third one, in some implementations). If the ratio between the first and second resistors is chosen properly, the first order effects of the temperature dependency of the diodes and the PTAT current will cancel out. The resulting voltage is about 1.2-1.3 volts, depending on the particular technology used, and is close to the theoretical bandgap of silicon at 0 K.

However, the diodes used in the bandgap voltage reference generate noise that is introduced into circuits coupled to the bandgap reference (voltage+noise). The diodes and support circuits used in the bandgap voltage reference require a lot of integrated circuit die real estate and consume a fair amount of power during operation thereof. Initial output voltage distribution from the bandgap voltage reference during startup is not stable until a certain time passes. The voltage from the bandgap reference also varies with temperature.

SUMMARY

What is needed is a better way to generate a low noise, low-temperature drift, stable upon startup voltage reference that uses less integrated circuit die real estate and consumes less power during operation thereof.

According to the teachings of this disclosure, a voltage reference is created from an operational amplifier circuit comprises two substantially identical P-channel metal oxide semiconductor (P-MOS) transistors with each one having a different gate dopant. The different gate dopants result in different threshold voltages for each of the two otherwise substantially identical P-MOS transistors. The difference between these two threshold voltages is then used to create a voltage reference equal to the difference.

The two P-MOS transistors are configured as a differential pair in an operational amplifier circuit. The two P-MOS transistors, each having a different gate dopant, are substantially identical otherwise so that temperature dependence of the threshold voltage is minimal and may be compensated for by changing the gain(s) of the associated P-MOS transistor(s). By implementing the two P-MOS transistors having the different gate dopants into an operational amplifier type of circuit, the total variation of the output reference voltage is minimized. Since P-MOS transistors are less susceptible to substrate noise than are diodes, noise generation/immunity is much better when using the P-MOS transistors then with a standard diode based voltage reference, e.g., bandgap voltage reference. Positive feedback in the operational amplifier circuit allows for quick startup and good stability. The simplicity of the operational amplifier circuit requires only a small area for fabrication on the integrated circuit die.

According to a specific example embodiment of this disclosure, a voltage reference fabricated on an integrated circuit die comprises: a first P-channel metal oxide semiconductor (P-MOS) transistor having an N-type polysilicon gate, wherein the N-type polysilicon gate causes the first P-MOS transistor to have a first threshold voltage; a second P-MOS transistor having a P-type polysilicon gate, wherein the P-type polysilicon gate causes the second P-MOS transistor to have a second threshold voltage; the first and second P-MOS transistors are configured as a differential pair of an operational amplifier; and the operational amplifier has an output voltage substantially equal to a difference between the first and the second threshold voltages.

According to another specific example embodiment of this disclosure, a method of fabricating a voltage reference on an integrated circuit die comprises the steps of: providing an N-type well/region in a silicon semiconductor integrated circuit die; covering at least a portion of the N-type well/region with an oxide layer in an area used to form gates of P-channel metal oxide semiconductor (P-MOS) transistors for an operational amplifier; covering the oxide layer with a polysilicon layer; implanting a P$^-$ dopant into the polysilicon layer; covering a portion of the P$^-$ doped polysilicon layer with a first resist mask; implanting an N$^+$ dopant into the P$^-$ doped polysilicon layer wherever the first resist mask does not cover the P$^-$ doped polysilicon layer; removing the first resist mask; covering a portion of the N$^+$ doped polysilicon layer and a portion of the P$^-$ doped polysilicon layer with a second resist mask; and removing the N$^+$ doped polysilicon layer to form an N-type polysilicon gate where not covered by the second resist mask, the P$^-$ doped polysilicon layer to form a P-type polysilicon gate where not covered by the second resist mask, and the oxide layer where not covered by the second resist mask.

BRIEF DESCRIPTION OF THE DRAWINGS

A more complete understanding of the present disclosure thereof may be acquired by referring to the following description taken in conjunction with the accompanying drawings wherein.

Figure 1:
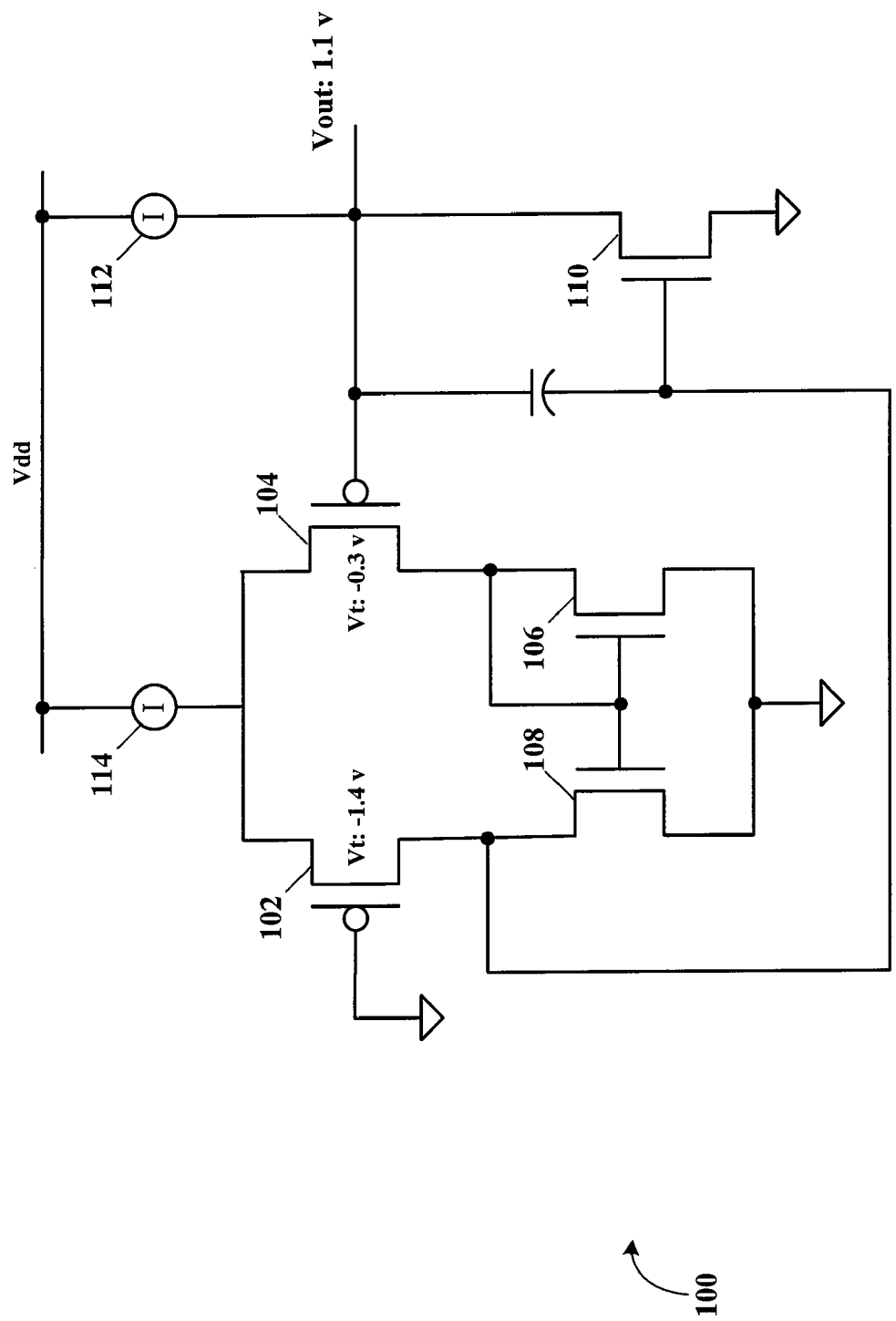
FIG. 1 is a schematic circuit diagram of an operational amplifier utilizing two substantially identical P-channel metal oxide semiconductor (P-MOS) transistors arranged in a differential pair with each one having a different gate dopant, according to specific example embodiments of this disclosure.

While the present disclosure is susceptible to various modifications and alternative forms, specific example embodiments thereof have been shown in the drawings and are herein described in detail. It should be understood, however, that the description herein of specific example embodiments is not intended to limit the disclosure to the particular forms disclosed herein, but on the contrary, this disclosure is to cover all modifications and equivalents as defined by the appended claims.

DETAILED DESCRIPTION

Referring now to the drawings, the details of example embodiments are schematically illustrated. Like elements in the drawings will be represented by like numbers, and similar elements will be represented by like numbers with a different lower case letter suffix.

Referring to FIG. 1, depicted is a schematic circuit diagram of an operational amplifier utilizing two substantially identical P-channel metal oxide semiconductor (P-MOS) transistors arranged in a differential pair with each one having a different gate dopant, according to specific example embodiments of this disclosure. An operational amplifier circuit, generally represented by the numeral 100, comprises P-MOS transistors 102 and 104 configured as a differential pair, N-MOS transistors 106 and 108, constant current sources 112 and 114, and an output transistor 110. The N-MOS transistors 108 and 106 are used as loads for the P-MOS transistors 102 and 104, respectively. Since the N-MOS transistors 106 and 108 are configured as a current mirror circuit, each of the P-MOS transistors 102 and 104 operate at substantially the same current.

The P-MOS transistors 102 and 104 each have a different gate dopant so as to produce a different threshold voltage, Vt, for each of the respective P-MOS transistors 102 and 104. For the P-MOS transistor 102 the threshold voltage is about −1.4 volts and for the P-MOS transistor 104 the threshold voltage is about −0.3 volts. Otherwise, the P-MOS transistors 102 and 104 are substantially identical so that temperature dependence of the threshold voltage is minimal and may be compensated for by changing the gain(s) of the associated P-MOS transistor(s) 102 and/or 104. By implementing the P-MOS transistors 102 and 104 with the different threshold voltages into an operational amplifier type of circuit 100, the voltage at the output of the operational amplifier circuit 100 is the difference of the aforementioned threshold voltages, i.e., Vout=1.1 volt. The variation of the output reference voltage is minimized since the structures of the P-MOS transistors 102 and 104 are substantially identical otherwise. Since the P-MOS transistors 102 and 104 are less susceptible to substrate noise than are diodes, noise generation/immunity is much better when using the P-MOS transistors 102 and 104 then with a standard diode based voltage reference, e.g., a bandgap voltage reference. Therefore the output, Vout=1.1 volt, of the operational amplifier circuit 100 may be used as a very stable and low noise voltage reference.

Figure 2:
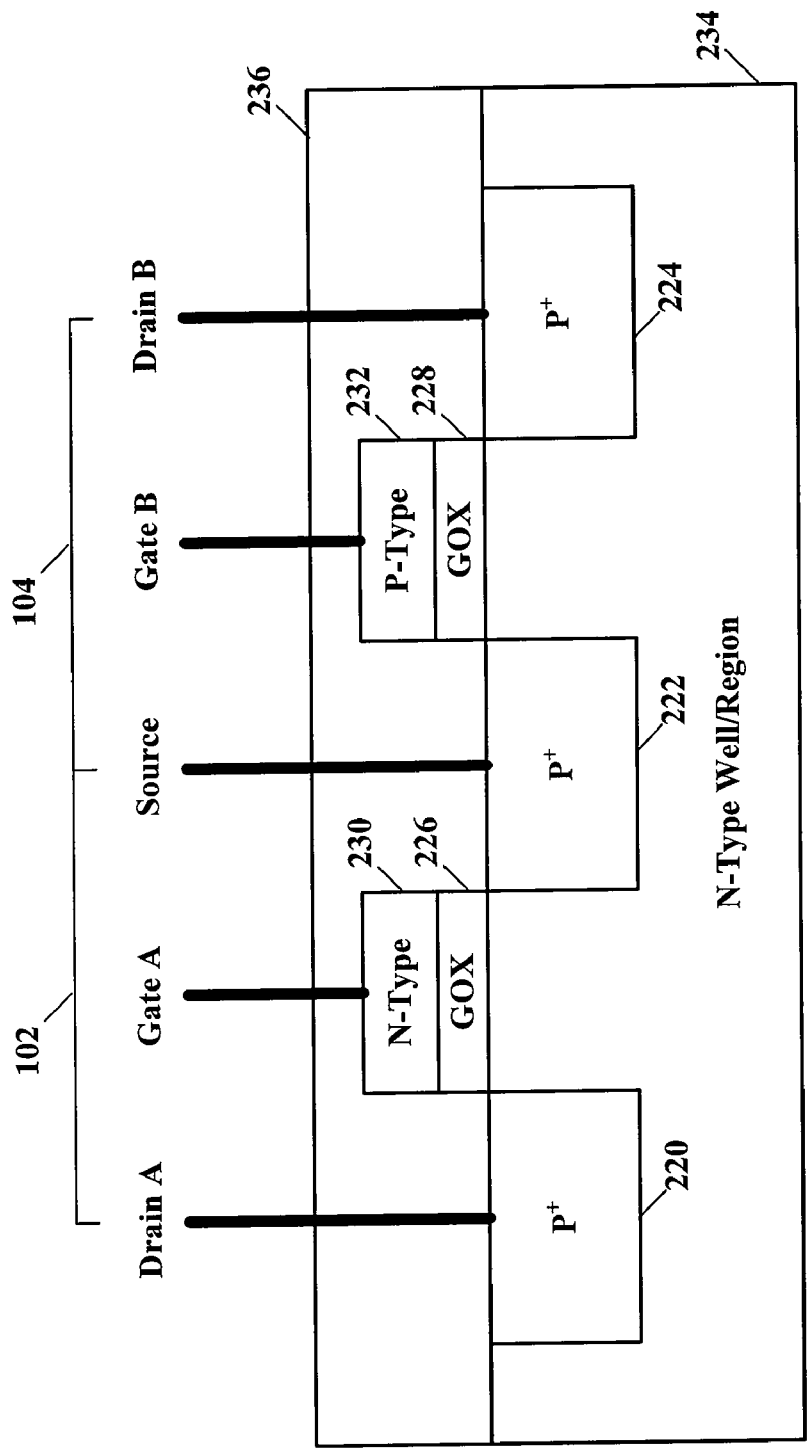
FIG. 2 is a schematic diagram of a cross sectional elevation of a pair of P-MOS transistors as shown in FIG. 1 and having a common source well, according a specific example embodiment of this disclosure.

Referring to FIG. 2, depicted is a schematic diagram of a cross sectional elevation of a pair of P-MOS transistors as shown in FIG. 1 and having a common source well, according a specific example embodiment of this disclosure. The P-MOS transistor 102 comprises a $P^+$ drain 220, a gate oxide 226, an N-type polysilicon gate 230 and a $P^+$ source 222. The P-MOS transistor 104 comprises a $P^+$ drain 224, a gate oxide 228, a P-type polysilicon gate 232 and the $P^+$ source 222. The $P^+$ source 222 is common for the pair of P-MOS transistors 102 and 104. The $P^+$ drain 220, the $P^+$ source 222 and the $P^+$ drain 224 are in an N-type well/region 234. The aforementioned elements of the P-MOS transistors 102 and 104 may be covered with a protective oxide layer 236. The source, gate and drain connections are schematically represented by heavy black lines.

Figure 3:
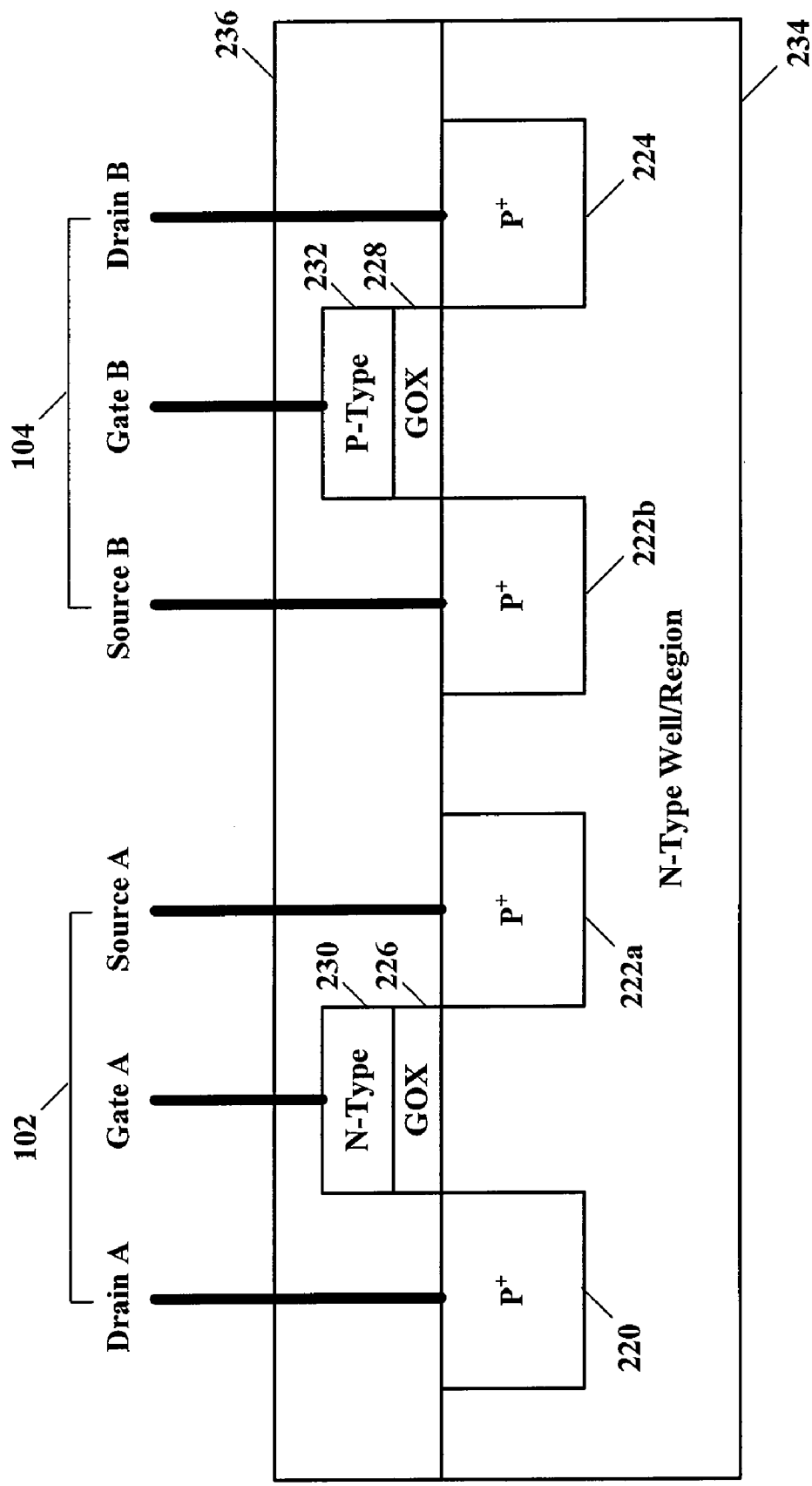
FIG. 3 is a schematic diagram of a cross sectional elevation of a pair of P-MOS transistors as shown in FIG. 1 and having individual source wells, according another specific example embodiment of this disclosure.

Referring to FIG. 3, depicted is a schematic diagram of a cross sectional elevation of a pair of P-MOS transistors as shown in FIG. 1 and having individual source wells, according another specific example embodiment of this disclosure. The P-MOS transistor 102 comprises a $P^+$ drain 220, a gate oxide 226, an N-type polysilicon gate 230 and a $P^{3+}$ source 222a. The P-MOS transistor 104 comprises a $P^+$ drain 224, a gate oxide 228, a P-type polysilicon gate 232 and a $P^+$ source 222b. The $P^+$ well sources 222a and 222b are separate for the pair of P-MOS transistors 102 and 104, but otherwise function substantially the same as the pair P-MOS transistors shown in FIG. 2. The $P^+$ drain 220, the $P^+$ source 222a, the $P^+$ drain 224 and the $P^+$ source 222b are in an N-type well/region 234. The aforementioned elements of the pair of P-MOS transistors 102 and 104 may be covered with a protective oxide layer 236. The source, gate and drain connections are schematically represented by heavy black lines.

The N-type polysilicon gate 230 configuration gives the P-MOS transistor 102 a threshold voltage, Vt, of about −1.4 volts. The P-type polysilicon gate 232 configuration gives the P-MOS transistor 104 a threshold voltage, Vt, of about −0.3 volts. The difference between the threshold voltage (−1.4 volts) of the P-MOS transistor 102 and the threshold voltage (−0.3 volts) of the P-MOS transistor 104 is approximately equal to the difference in the work function of the gate electrodes. Adding an additional light P-type implant, e.g., boron, into the channels of both P-MOS transistors 102 and 104 can reduce threshold voltages, e.g., approximately −1.1 volts and approximately 0.0 volts, respectively. Having this small a threshold voltage may push the P-MOS transistor 104 into a depletion type mode of operation and can create increased operational headroom for lower voltage operation of the voltage reference operational amplifier circuit, according to the teachings of this disclosure. Fabrication of the N-type polysilicon gate 230 and the P-type polysilicon gate 232 are discussed more fully in the description relating to FIGS. 4(a)-(d) hereinbelow.

Figure 4:
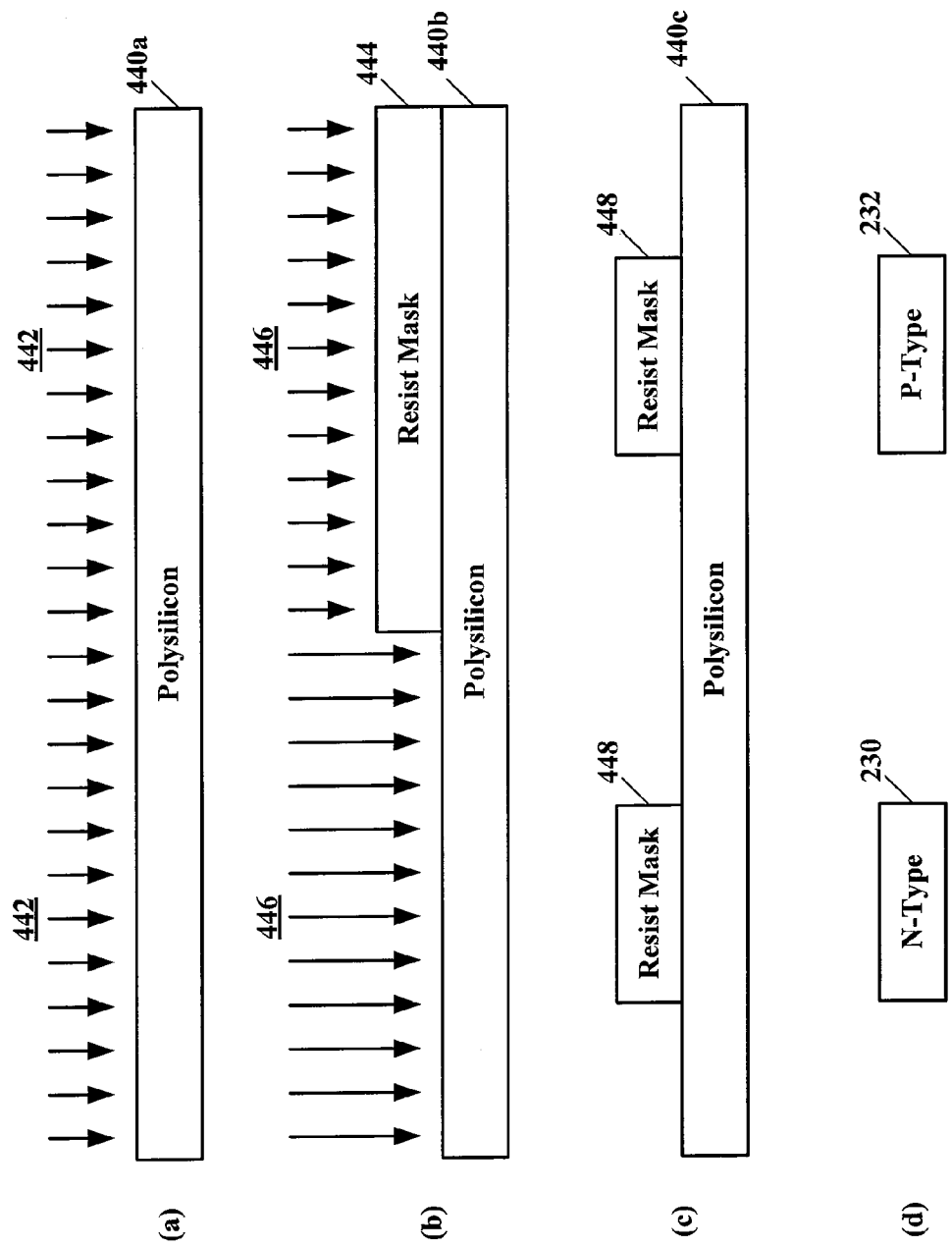
FIGS. 4(a)-(d) are schematic process diagrams of process steps used in fabricating N-type and P-type polysilicon gates for the pair of P-MOS transistors shown in FIGS. 1, 2 and 3, according to the specific example embodiments of this disclosure.

Referring to FIGS. 4(a)-(d), depicted are schematic process diagrams of process steps used in fabricating N-type and P-type polysilicon gates for the pair of P-MOS transistors shown in FIGS. 1, 2 and 3, according to the specific example embodiments of this disclosure. In FIG. 4(a) $P^-$ dopant 442 is implanted into a layer of polysilicon 440a. In FIG. 4(b) a resist mask 444 covers a portion of the $P^-$ dopant implanted polysilicon 440b, and then N+ dopant 446 is implanted in the portion of the polysilicon 440b that is not covered by the resist mask 444. In FIG. 4(c) the layer of $P^-$ dopant and $N^+$ dopant implanted polysilicon 440c has mask pattern 448 placed over those portions of the multiply doped polysilicon 440c that are to be retained, then the polysilicon 440c is etched away where not covered by the mask pattern 448. This leaves an isolated N-type polysilicon gate 230 and an isolated P-type polysilicon gate 232 as shown in FIG. 4(d). The P+ drains 220 and 224, and the P+ source(s) 222 shown in FIGS. 2 and 3 are then created and self-aligned with the respective N-type polysilicon gate 230 and the respective P-type polysilicon gate 232 to produce the pair of P-MOS transistors 102 and 104, as described hereinabove. The aforementioned optional light P-type dopant may be implanted into the N-type well/region 234 before a gate oxide layer (e.g., thermally grown oxidation is used to create the gate oxides 226 and 228) and a polysilicon layer (e.g., polysilicon deposition is used to create the polysilicon gates oxides 230 and 232) are placed over the N-type well/region 234.

While embodiments of this disclosure have been depicted, described, and are defined by reference to example embodiments of the disclosure, such references do not imply a limitation on the disclosure, and no such limitation is to be inferred. The subject matter disclosed is capable of considerable modification, alteration, and equivalents in form and function, as will occur to those ordinarily skilled in the pertinent art and having the benefit of this disclosure. The depicted and described embodiments of this disclosure are examples only, and are not exhaustive of the scope of the disclosure.

What is claimed is:

1. A voltage reference fabricated on an integrated circuit die, comprising:
   a first P-channel metal oxide semiconductor (P-MOS) transistor having an N-type polysilicon gate, wherein the N-type polysilicon gate causes the first P-MOS transistor to have a first threshold voltage;
   a second P-MOS transistor having a P-type polysilicon gate, wherein the P-type polysilicon gate causes the second P-MOS transistor to have a second threshold voltage;
   the first and second P-MOS transistors are configured as a differential pair of an operational amplifier; and
   the operational amplifier has an output voltage substantially equal to a difference between the first and the second threshold voltages.

2. The voltage reference according to claim 1, wherein the first threshold voltage is about a minus 1.4 volts.

3. The voltage reference according to claim 2, wherein the second threshold voltage is about a minus 0.3 volts.

4. The voltage reference according to claim 3, wherein the output voltage of the operational amplifier is about 1.1 volts.

5. The voltage reference according to claim 1, further comprising a lightly doped P-type implant in an N-type well/region of the integrated circuit die where gate channels of the first and second P-MOS transistors are located.

6. The voltage reference according to claim 5, wherein the first threshold voltage is about a minus 1.1 volts.

7. The voltage reference according to claim 6, wherein the second threshold voltage is about 0.0 volts.

8. The voltage reference according to claim 7, wherein the output voltage of the operational amplifier is about 1.1 volts.

9. The voltage reference according to claim 1, wherein the operational amplifier further comprises a first current source connected to sources of the first and second P_MOS transistors and a current mirror coupled to a drain of the first P_MOS transistor and a drain of the second P-MOS transistor.

10. The voltage reference according to claim 9, wherein the operational amplifier further comprises a second current source connected to an output transistor and the gate of the second P-MOS transistor, wherein a gate of the output transistor is coupled with the drain of the first P-MOS transistor.

11. The voltage reference according to claim 10, wherein the gate of the first P-MOS transistor and the output transistor are coupled with a reference potential.

12. A voltage reference fabricated on an integrated circuit die, comprising:
    a first P-channel metal oxide semiconductor (P-MOS) transistor having an N-type polysilicon gate, wherein the N-type polysilicon gate causes the first P-MOS transistor to have a first threshold voltage;
    a second P-MOS transistor having a P-type polysilicon gate, wherein the P-type polysilicon gate causes the second P-MOS transistor to have a second threshold voltage;
    the first and second P-MOS transistors are configured as a differential pair of an operational amplifier wherein a source of the first P-MOS transistor is connected with a source of the second P-MOS transistor; and
    the operational amplifier has an output voltage substantially equal to a difference between the first and the second threshold voltages.

13. The voltage reference according to claim 12, wherein the first threshold voltage is about a minus 1.4 volts.

14. The voltage reference according to claim 13, wherein the second threshold voltage is about a minus 0.3 volts.

15. The voltage reference according to claim 14, wherein the output voltage of the operational amplifier is about 1.1 volts.

16. The voltage reference according to claim 12, further comprising a lightly doped P-type implant in an N-type well/region of the integrated circuit die where gate channels of the first and second P-MOS transistors are located.

17. The voltage reference according to claim 16, wherein the first threshold voltage is about a minus 1.1 volts.

18. The voltage reference according to claim 17, wherein the second threshold voltage is about 0.0 volts.

19. The voltage reference according to claim 18, wherein the output voltage of the operational amplifier is about 1.1 volts.

20. The voltage reference according to claim 12, wherein the operational amplifier further comprises a first current source connected to the sources of the first and second P_MOS transistors and a current mirror coupled to a drain of the first P_MOS transistor and a drain of the second P-MOS transistor.

21. The voltage reference according to claim 20, wherein the operational amplifier further comprises a second current source connected to an output transistor and the gate of the second P-MOS transistor, wherein a gate of the output transistor is coupled with the drain of the first P-MOS transistor.

22. The voltage reference according to claim 21, wherein the gate of the first P-MOS transistor and the output transistor are coupled with a reference potential.

* * * * *